United States Patent
Harada

(10) Patent No.: US 9,417,265 B2
(45) Date of Patent: Aug. 16, 2016

(54) SIGNAL DISPLAY DEVICE, METHOD, AND RECORDING MEDIUM

(75) Inventor: Yuichiro Harada, Gunma (JP)

(73) Assignee: ADVANTEST CORPORATION, Tokyo (JP)

( * ) Notice: Subject to any disclaimer, the term of this patent is extended or adjusted under 35 U.S.C. 154(b) by 601 days.

(21) Appl. No.: 13/459,597

(22) Filed: Apr. 30, 2012

(65) Prior Publication Data
US 2012/0319855 A1  Dec. 20, 2012

(30) Foreign Application Priority Data
Jun. 15, 2011 (JP) .................. 2011-133377

(51) Int. Cl.
*G08B 21/00* (2006.01)
*G01R 13/02* (2006.01)

(52) U.S. Cl.
CPC ........ *G01R 13/0236* (2013.01); *G01R 13/0227* (2013.01)

(58) Field of Classification Search
CPC ............. G06F 3/1431; G09G 2340/0492; G09G 3/3611; G01R 13/0227; G01R 13/0272; G01R 13/02
USPC ................ 324/76.19, 76.22, 76.11
See application file for complete search history.

(56) References Cited

U.S. PATENT DOCUMENTS 4,868,496 A * 9/1989 Havel ........................... 324/115
5,397,981 A * 3/1995 Wiggers .................. 324/121 R
6,233,529 B1   5/2001 Nonaka

FOREIGN PATENT DOCUMENTS

JP   11-118848 A   4/1999
JP   2011-27583   2/2011

OTHER PUBLICATIONS

Japan Office action, dated Apr. 4, 2013 along with an english translation thereof.

* cited by examiner

*Primary Examiner* — Vincent Q Nguyen
(74) *Attorney, Agent, or Firm* — Greenblum & Bernstein P.L.C.

(57) ABSTRACT

According to the present invention, a signal display device includes: a first characteristic value measurement unit, a display unit, a second characteristic value measurement unit, and a display form changing unit. The first characteristic value measurement unit measures any one of characteristic values of a signal to be measured, and the display unit displays the characteristic value measured by the first characteristic value measurement unit while the characteristic value is associated with time. The second characteristic value measurement unit measures any one of the characteristic values of the signal to be measured, and the display form changing unit changes a display form on the display unit according to the characteristic value measured by the second characteristic value measurement unit.

7 Claims, 9 Drawing Sheets

SIGNAL DISPLAY DEVICE, METHOD, AND RECORDING MEDIUM

BACKGROUND ART

1. Technical Field of the Invention

The present invention relates to a display of characteristic values (such as frequency, phase, and level) of a signal while the characteristic values are associated with time.

2. Related Art

A spectrum analyzer which measures a change in frequency of a signal with respect to time has conventionally been known (refer to Abstract of a patent document 1 (Japanese Patent Application Laid-open No. Hei 11-118848)).

On this occasion, a case in which a signal repeats ON/OFF is considerable. FIG. 9 is a diagram showing a conventional example showing the frequency of a signal with respect to time in the case in which the signal repeats ON/OFF. The frequency of a noise is shown in a period in which the signal is OFF (absent), and the frequency of the signal is shown in a period in which the signal is ON (present). It is generally often the case that the frequency of the signal is to be measured, and the frequency of the noise is not to be measured.

SUMMARY OF THE INVENTION

However, the frequency of the noise largely fluctuates in the conventional case, and the display of the frequency during the period in which the signal is OFF (absent) is thus remarkable. Therefore, the display of the frequency during the period in which the signal is ON (present) is hard to view on the contrary.

If the characteristic values (such as frequency, phase, and level) of a signal are displayed while the characteristic values are associated with time in this way, there poses the problem that the characteristic values of the signal to be measured become hard to view on the contrary.

In view of the foregoing problem, an object of the present invention is to display characteristic values of a signal to be measured in a manner easy to view.

According to the present invention, a signal display device includes: a first characteristic value measurement unit that measures any one of characteristic values of a signal to be measured; a display unit that displays the characteristic value measured by the first characteristic value measurement unit while the characteristic value is associated with time; a second characteristic value measurement unit that measures any one of the characteristic values of the signal to be measured; and a display form changing unit that changes a display form on the display unit according to the characteristic value measured by the second characteristic value measurement unit.

According to the thus constructed signal display device, a first characteristic value measurement unit measures any one of characteristic values of a signal to be measured. A display unit displays the characteristic value measured by the first characteristic value measurement unit while the characteristic value is associated with time. A second characteristic value measurement unit measures any one of the characteristic values of the signal to be measured. A display form changing unit changes a display form on the display unit according to the characteristic value measured by the second characteristic value measurement unit.

According to the signal display device of the present invention, the characteristic value may be at least one of the frequency, the phase, and the level of the signal to be measured.

According to the signal display device of the present invention, the display form changing unit may cause the display unit to display the signal to be measured the characteristic value of which is more than a predetermined value, and cause the display unit not to display the signal to be measured the characteristic value of which is less than the predetermined value.

According to the signal display device of the present invention, the display form changing unit may cause the display unit to display the signal to be measured the characteristic value of which is less than a predetermined value, and cause the display unit not to display the signal to be measured the characteristic value of which is more than the predetermined value.

According to the signal display device of the present invention, the display form changing unit may cause the display unit to display the signal to be measured the characteristic value of which is inside a predetermined range, and cause the display unit not to display the signal to be measured the characteristic value of which is outside the predetermined range.

According to the signal display device of the present invention, the display form changing unit may cause the display unit to display the signal to be measured the characteristic value of which is outside a predetermined range, and cause the display unit not to display the signal to be measured the characteristic value of which is inside the predetermined range.

According to the signal display device of the present invention, the display form changing unit may change a display color of the signal to be measured on the display unit according to whether the characteristic value is more than a predetermined value or not.

According to the signal display device of the present invention, the display form changing unit may change a display color of the signal to be measured on the display unit according to whether the characteristic value is inside a predetermined value or not.

According to the present invention, a signal display method includes: a first characteristic value measurement step that measures any one of characteristic values of a signal to be measured; a display step that displays the characteristic value measured by the first characteristic value measurement step while the characteristic value is associated with time; a second characteristic value measurement step that measures any one of the characteristic values of the signal to be measured; and a display form changing step that changes a display form on the display step according to the characteristic value measured by the second characteristic value measurement step.

The present invention is a program of instructions for execution by a computer to perform a signal display process, the signal display process including: a first characteristic value measurement step that measures any one of characteristic values of a signal to be measured; a display step that displays the characteristic value measured by the first characteristic value measurement step while the characteristic value is associated with time; a second characteristic value measurement step that measures any one of the characteristic values of the signal to be measured; and a display form changing step that changes a display form on the display step according to the characteristic value measured by the second characteristic value measurement step.

The present invention is a computer-readable medium having a program of instructions for execution by a computer to perform a signal display process, the signal display process including: a first characteristic value measurement step that measures any one of characteristic values of a signal to be measured; a display step that displays the characteristic value measured by the first characteristic value measurement step while the characteristic value is associated with time; a second characteristic value measurement step that measures any one of the characteristic values of the signal to be measured; and a display form changing step that changes a display form on the display step according to the characteristic value measured by the second characteristic value measurement step.

PREFERRED EMBODIMENTS

Figure 1:
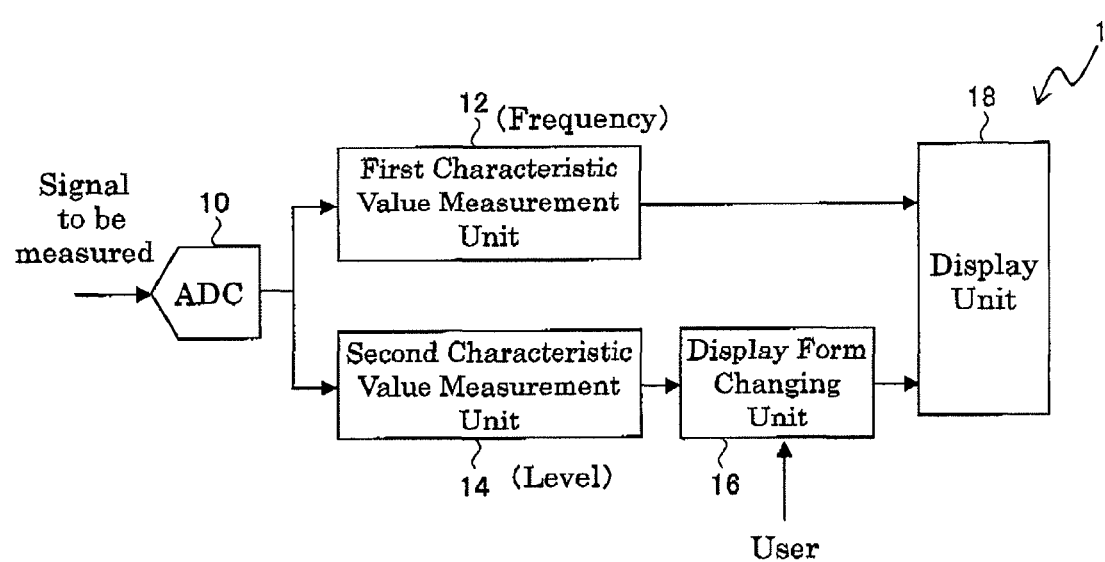
FIG. 1 is a diagram showing a configuration of a signal display device 1 according to a first embodiment of the present invention.

A description will now be given of an embodiment of the present invention referring to drawings.
First Embodiment
FIG. 1 is a diagram showing a configuration of a signal display device 1 according to a first embodiment of the present invention. The signal display device 1 includes an A/D converter 10, a first characteristic value measurement unit 12, a second characteristic value measurement unit 14, a display form changing unit 16, and a display unit 18.

The signal display device 1 receives a signal to be measured (analog). The A/D converter 10 converts the analog signal to be measured into the digital signal to be measured.

The first characteristic value measurement unit 12 receives the signal to be measured (digital) from the A/D converter 10, and measures any one of characteristic values of the signal to be measured. The characteristic value is at least one of the frequency, the phase, and the level of the signal to be measured. It should be noted that the characteristic value measured by the first characteristic value measurement unit 12 is the frequency according to this embodiment of the present invention.

The second characteristic value measurement unit 14 receives the signal to be measured (digital) from the A/D converter 10, and measures any one of characteristic values of the signal to be measured. It should be noted that the characteristic value measured by the second characteristic value measurement unit 14 is the signal level according to this embodiment of the present invention.

The display unit 18 displays the characteristic value (frequency) measured by the first characteristic value measurement unit 12 while the characteristic value (frequency) is associated with time.

The display form changing unit 16 changes the display form on the display unit 18 according to the characteristic value (signal level) measured by the second characteristic value measurement unit 14.

Figure 2:
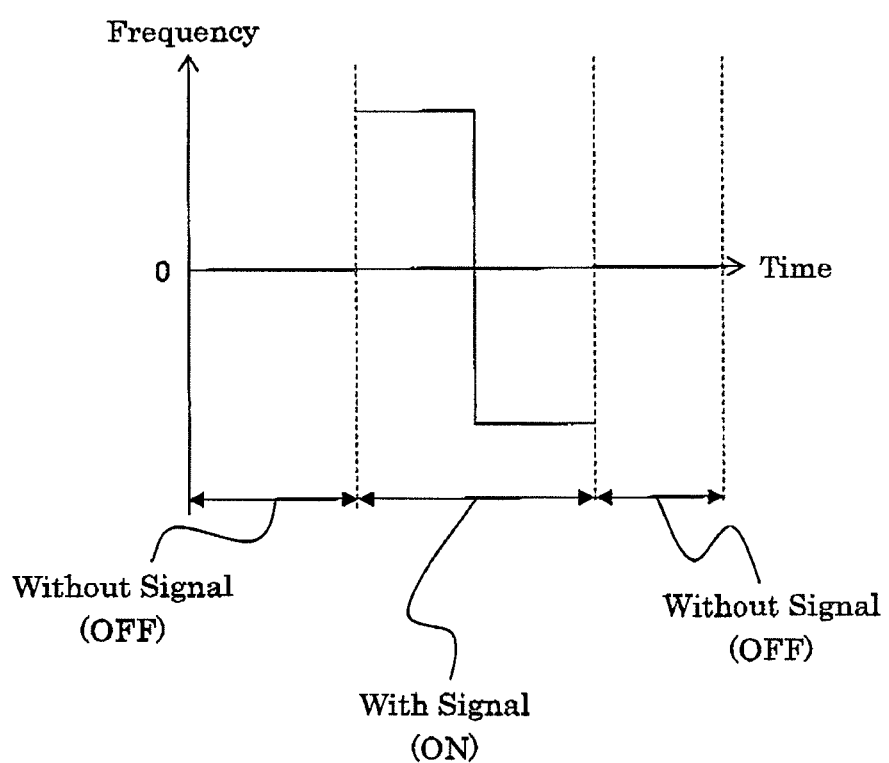
FIG. 2 is a diagram showing a display form in which the characteristic value (frequency) of the signal to be measured the characteristic value (signal level) of which is more than a predetermined value is displayed by the display unit 18, and the characteristic value (frequency) of the signal to be measured the characteristic value (signal level) of which is less than the predetermined value is not displayed by the display unit 18.

FIG. 2 is a diagram showing a display form in which the characteristic value (frequency) of the signal to be measured the characteristic value (signal level) of which is more than a predetermined value is displayed by the display unit 18, and the characteristic value (frequency) of the signal to be measured the characteristic value (signal level) of which is less than the predetermined value is not displayed by the display unit 18.

Figure 3:
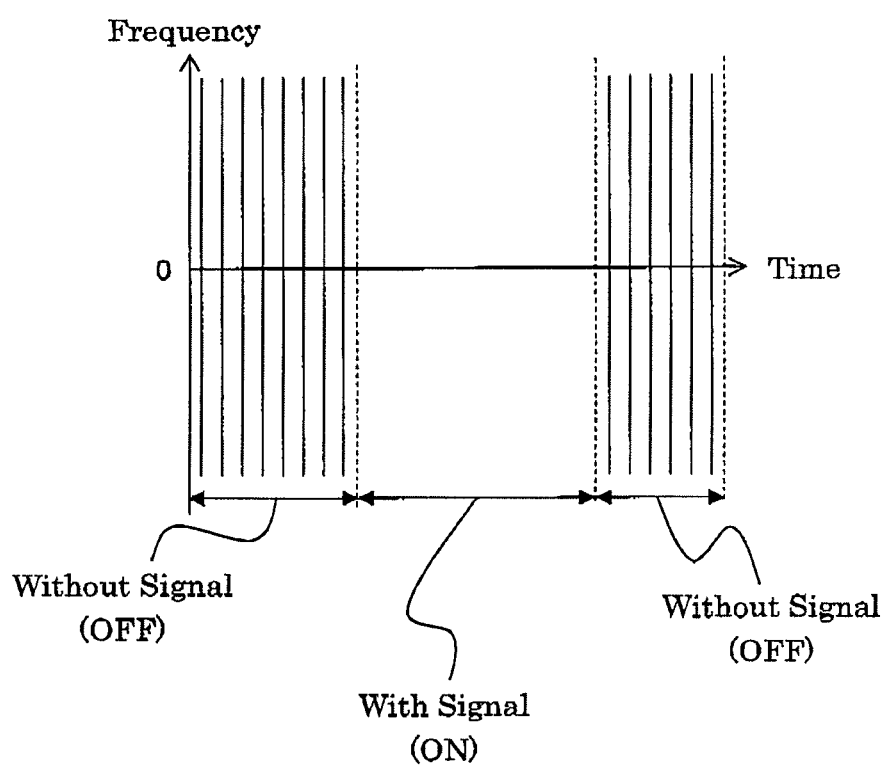
FIG. 3 is a diagram showing a display form in which the characteristic value (frequency) of the signal to be measured the characteristic value (signal level) of which is less than the predetermined value is displayed by the display unit 18, and the characteristic value (frequency) of the signal to be measured the characteristic value (signal level) of which is more than the predetermined value is not displayed by the display unit 18.

FIG. 3 is a diagram showing a display form in which the characteristic value (frequency) of the signal to be measured the characteristic value (signal level) of which is less than the predetermined value is displayed by the display unit 18, and the characteristic value (frequency) of the signal to be measured the characteristic value (signal level) of which is more than the predetermined value is not displayed by the display unit 18.

Figure 4:
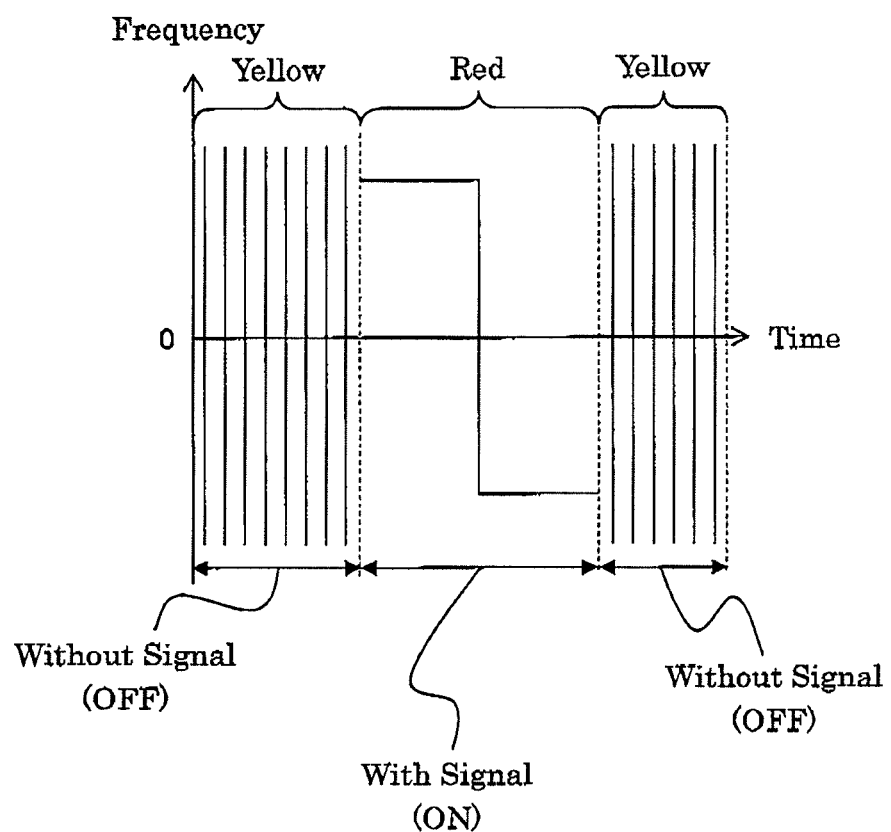
FIG. 4 is a display form in which a display color of the characteristic value (frequency) is changed on the display unit 18 according to whether the characteristic value (signal level) is more than the predetermined value or not.

FIG. 4 is a display form in which a display color of the characteristic value (frequency) is changed on the display unit 18 according to whether the characteristic value (signal level) is more than the predetermined value or not.

The display forms on the display unit 18 include:

(1) the form in which the characteristic value (frequency) of the signal to be measured the characteristic value (signal level) of which is more than a predetermined value is displayed by the display unit 18, and the characteristic value (frequency) of the signal to be measured the characteristic value (signal level) of which is less than the predetermined value is not displayed by the display unit 18 (refer to FIG. 2), (2) the form in which the characteristic value (frequency) of the signal to be measured the characteristic value (signal level) of which is less than a predetermined value is displayed by the display unit 18, and the characteristic value (frequency) of the signal to be measured the characteristic value (signal level) of which is more than the predetermined value is not displayed by the display unit 18 (refer to FIG. 3), and (3) the form in which the display color of the characteristic value (frequency) of the signal to be measured is changed on the display unit 18 according to whether the characteristic value (signal level) is more than a predetermined value or not (refer to FIG. 4).

It should be noted that the predetermined value and which display forms (1)-(3) to select can be set by a user of the signal display device 1 outside the signal display device 1.

A description will now be given of an operation of the first embodiment of the present invention.

The signal display device 1 receives the signal to be measured (analog). The signal to be measured (analog) is converted by the A/D converter 10 into the digital form. The signal to be measured converted into the digital form is fed to the first characteristic value measurement unit 12 and the second characteristic value measurement unit 14.

The first characteristic value measurement unit 12 measures the frequency of the signal to be measured (digital), and feeds the measurement result to the display unit 18.

The second characteristic value measurement unit 14 measures the signal level of the signal to be measured (digital), and feeds the measurement result to the display form changing unit 16.

Referring to FIG. 2, the display form changing unit 16 causes the display unit 18 to display the frequency of the signal to be measured the signal level of which is more than a predetermined value (refer to a section, "WITH SIGNAL" in FIG. 2). Further, the display form changing unit 16 causes the display unit 18 not to display the frequency of the signal to be measured the signal level of which is less than the predetermined value (refer to sections, "WITHOUT SIGNAL" in FIG. 2).

Figure 9:
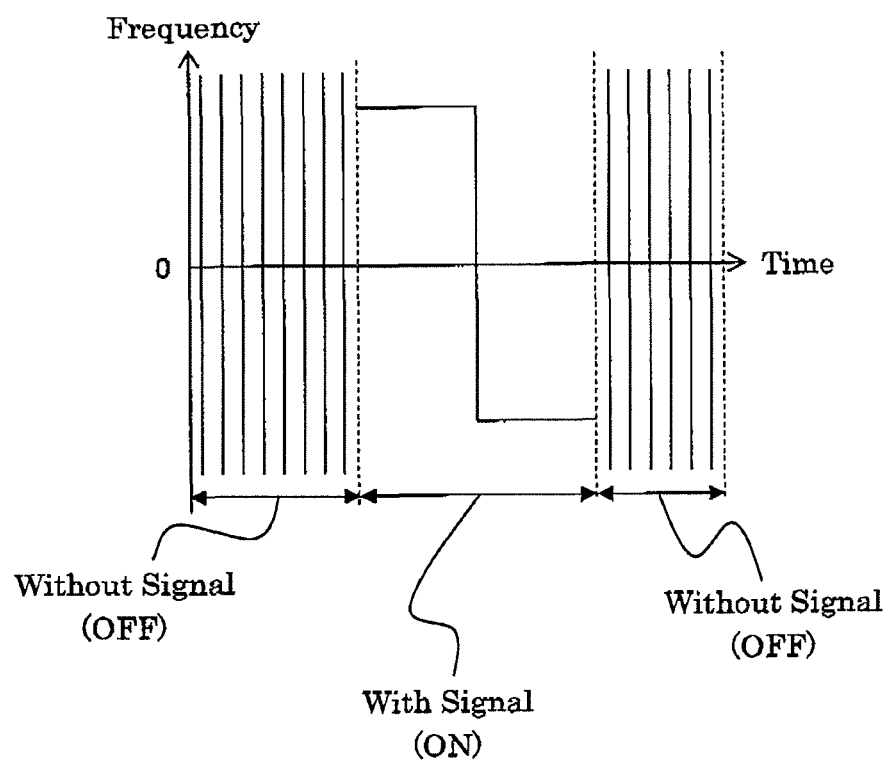
FIG. 9 is a diagram showing a conventional example showing the frequency of a signal with respect to time in the case in which the signal repeats ON/OFF.

Compared with FIG. 9, there is not a display in the sections, "WITHOUT SIGNAL" (namely a noise) in FIG. 2, and the display of the frequency in the section, "WITH SIGNAL" (namely the signal to be measured) can be made easy to view.

Moreover, referring to FIG. 3, the display form changing unit 16 may cause the display unit 18 to display the frequency of the signal to be measured the signal level of which is less than a predetermined value (refer to the sections, "WITHOUT SIGNAL" in FIG. 3). In this case, the display form changing unit 16 causes the display unit 18 not to display the frequency of the signal to be measured the signal level of which is more than the predetermined value (refer to the section, "WITH SIGNAL" in FIG. 3).

Compared with FIG. 9, there is not a display in the section, "WITH SIGNAL" (namely the signal to be measured) in FIG. 3, and the display of the frequency in the sections, "WITHOUT SIGNAL" (namely the noise) can be easy to view. The display form shown in FIG. 3 is effective for observing the frequency of the noise.

Further, referring to FIG. 4, the display form changing unit 16 may change the display color of the characteristic value (frequency) of the signal to be measured on the display unit 18 according to whether the signal level is more than a predetermined value or not. For example, the sections, "WITHOUT SIGNAL" in FIG. 4 may be displayed in red, and the section, "WITH SIGNAL" in FIG. 4 may be displayed in yellow.

Compared with FIG. 9, the display color in the section, "WITH SIGNAL" (namely the signal to be measured) in FIG. 4 and the display color in the sections, "WITHOUT SIGNAL" (namely the noise) are different from each other, which is effective both for a case of observing the frequency of the signal to be measured and for a case of observing the frequency of the noise.

According to the first embodiment, the change in the display form by the display form changing unit 16 (referring to FIGS. 2-4) can make the display of the characteristic value (such as the frequency) of a signal subject to measure (signal to be measured or the noise) easy to view.

Second Embodiment

A second embodiment does not change the display form on the display unit 18 according to whether the characteristic value (signal level) is more than a predetermined value or not, but changes the display form on the display unit 18 according to whether the characteristic value (signal level) is inside a predetermined range or not, which is a point different from the first embodiment.

The configuration of the signal display device 1 according to the second embodiment is the same as that of the first embodiment (refer to FIG. 1). The A/D converter 10, the first characteristic value measurement unit 12, the second characteristic value measurement unit 14, and the display unit 18 of the signal display device 1 according to the second embodiment are the same as those of the first embodiment, and a description thereof is therefore omitted.

The display form changing unit 16 changes the display form on the display unit 18 according to the characteristic value (signal level) measured by the second characteristic value measurement unit 14.

Figure 5:
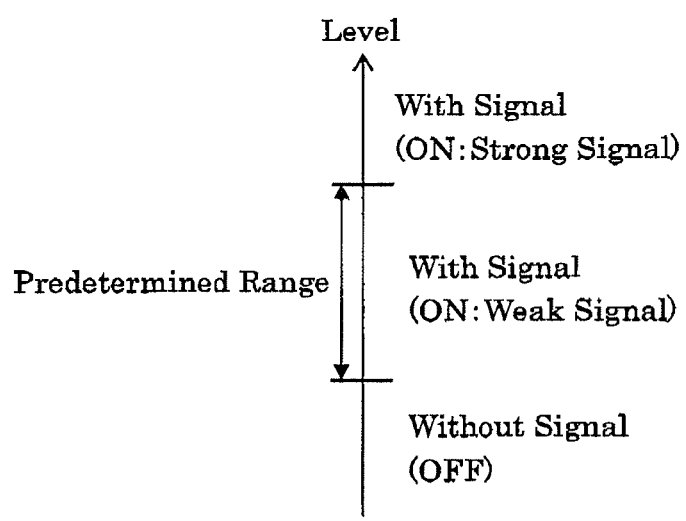
FIG. 5 shows a signal level according to the second embodiment.

FIG. 5 shows a signal level according to the second embodiment. It is assumed that the signal level can be divided into three levels including WITHOUT SIGNAL (OFF), WITH WEAK SIGNAL (ON), and WITH STRONG SIGNAL (ON). On this occasion, it is assumed that the range, WITH WEAK SIGNAL (ON) is the predetermined range. On this occasion, it is assumed that a negative section of the frequency with signal (ON) is weak, and a positive section of the frequency with signal (ON) is strong. It should be noted that the predetermined range does not necessarily correspond to WITH WEAK SIGNAL (ON), and the predetermined range shown in FIG. 5 is simply an example.

The display form changing unit 16 changes the display form on the display unit 18 according to the characteristic value (signal level) measured by the second characteristic value measurement unit 14.

Figure 6:
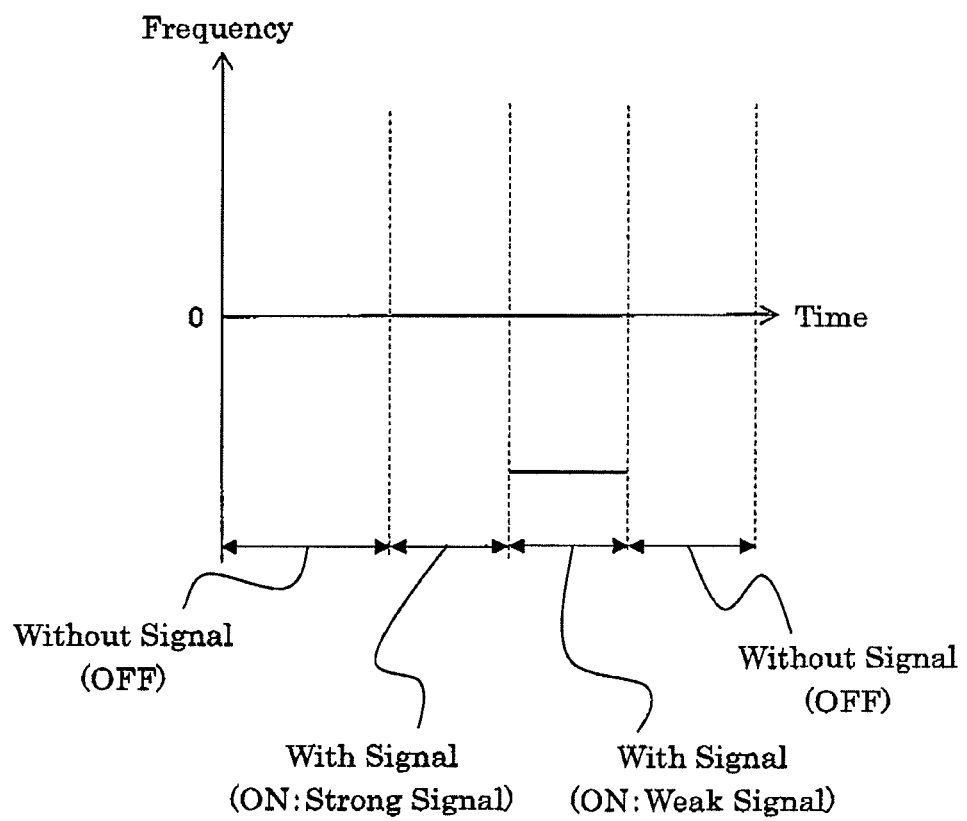
FIG. 6 is a diagram showing a display form in which the characteristic value (frequency) of the signal to be measured the characteristic value (signal level) of which is inside the predetermined range is displayed by the display unit 18, and the characteristic value (frequency) of the signal to be measured the characteristic value (signal level) of which is outside the predetermined range is not displayed by the display unit 18.

FIG. 6 is a diagram showing a display form in which the characteristic value (frequency) of the signal to be measured the characteristic value (signal level) of which is inside the predetermined range is displayed by the display unit 18, and the characteristic value (frequency) of the signal to be measured the characteristic value (signal level) of which is outside the predetermined range is not displayed by the display unit 18.

Figure 7:
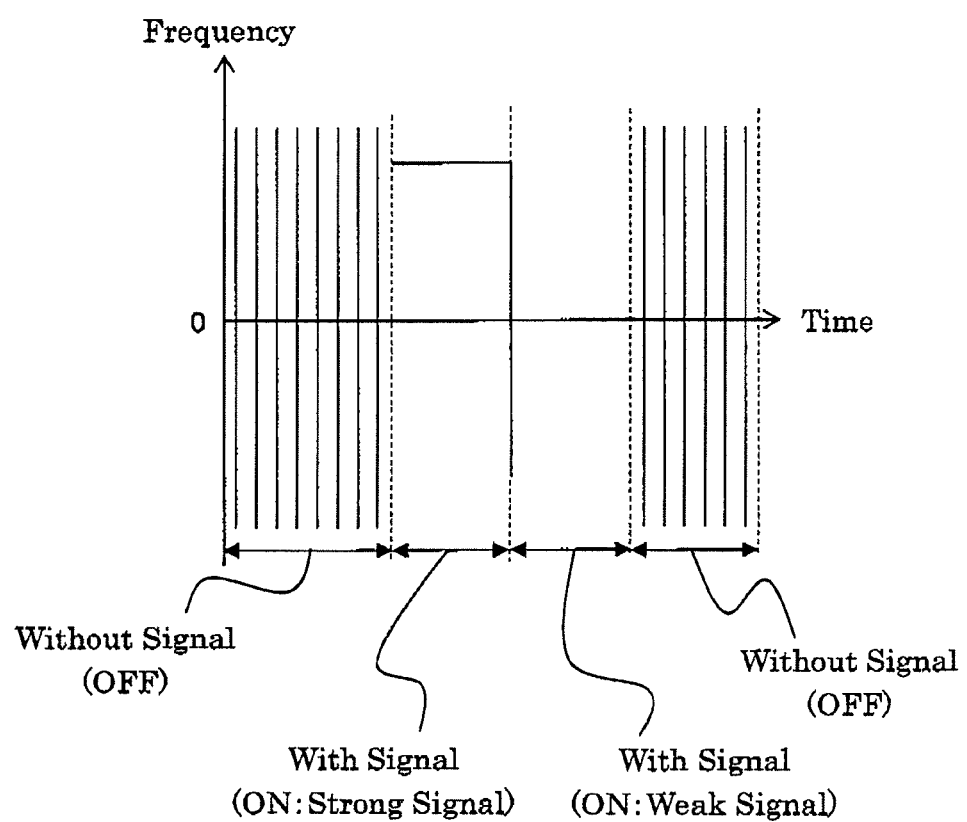
FIG. 7 is a diagram showing a display form in which the characteristic value (frequency) of the signal to be measured the characteristic value (signal level) of which is outside the predetermined range is displayed by the display unit 18, and the characteristic value (frequency) of the signal to be measured the characteristic value (signal level) of which is inside the predetermined range is not displayed by the display unit 18.

FIG. 7 is a diagram showing a display form in which the characteristic value (frequency) of the signal to be measured the characteristic value (signal level) of which is outside the predetermined range is displayed by the display unit 18, and the characteristic value (frequency) of the signal to be measured the characteristic value (signal level) of which is inside the predetermined range is not displayed by the display unit 18.

Figure 8:
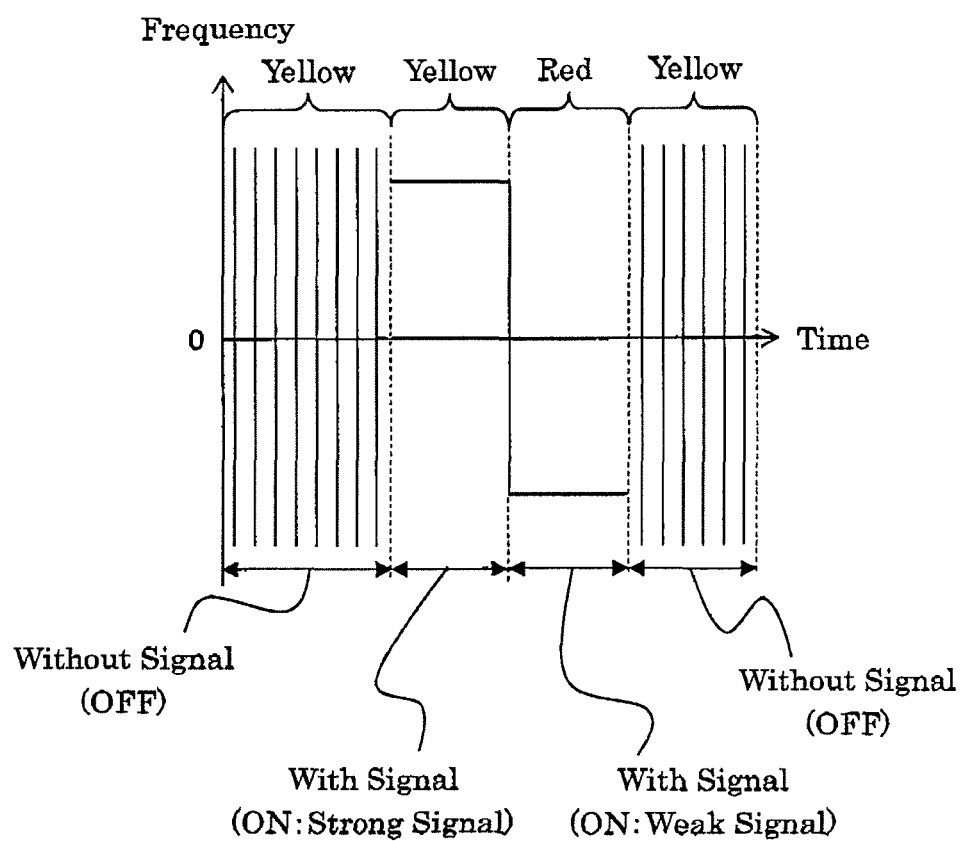
FIG. 8 is a display form in which a display color of the characteristic value (frequency) of the signal to be measured is changed on the display unit 18 according to whether the characteristic value (signal level) is inside the predetermined range or not.

FIG. 8 is a display form in which a display color of the characteristic value (frequency) of the signal to be measured is changed on the display unit 18 according to whether the characteristic value (signal level) is inside the predetermined range or not.

The display forms on the display unit 18 include:

(1) the form in which the characteristic value (frequency) of the signal to be measured the characteristic value (signal level) of which is inside a predetermined range (WITH WEAK SIGNAL (ON)) is displayed by the display unit 18, and the characteristic value (frequency) of the signal to be measured the characteristic value (signal level) of which is outside the predetermined range is not displayed by the display unit 18 (refer to FIG. 6), (2) the form in which the characteristic value (frequency) of the signal to be measured the characteristic value (signal level) of which is outside the predetermined range is displayed by the display unit 18, and the characteristic value (frequency) of the signal to be measured the characteristic value (signal level) of which is outside the predetermined range (WITH WEAK SIGNAL (ON)) is not displayed by the display unit 18 (refer to FIG. 7), and (3) the form in which the display color of the characteristic value (frequency) is changed on the display unit 18 according to whether the characteristic value (signal level) is inside the predetermined range (WITH WEAK SIGNAL (ON)) or not (refer to FIG. 8).

It is assumed that the predetermined range and which display forms (1)-(3) to select can be set by the user of the signal display device 1 outside the signal display device 1.

A description will now be given of an operation of the second embodiment of the present invention.

The signal display device 1 receives a signal to be measured (analog). The signal to be measured (analog) is converted by the A/D converter 10 into the digital form. The signal to be measured converted into the digital form is fed to the first characteristic value measurement unit 12 and the second characteristic value measurement unit 14.

The first characteristic value measurement unit 12 measures the frequency of the signal to be measured (digital), and feeds the measurement result to the display unit 18.

The second characteristic value measurement unit 14 measures the signal level of the signal to be measured (digital), and feeds the measurement result to the display form changing unit 16.

Referring to FIG. 6, the display form changing unit 16 causes the display unit 18 to display the frequency of the signal to be measured the signal level of which is inside the predetermined range (refer to the section, "WITH WEAK SIGNAL (ON)" in FIG. 6). Further, the display form changing unit 16 causes the display unit 18 not to display the frequency of the signal to be measured the signal level of which is outside the predetermined range (refer to "WITHOUT SIGNAL" and "WITH STRONG SIGNAL (ON)" in FIG. 2).

Compared with FIG. 9, there are not displays for sections, "WITHOUT SIGNAL" (namely the noise) and "WITH STRONG SIGNAL (ON)" in FIG. 6, and the display of the frequency in the section, "WITH WEAK SIGNAL (ON)" can be made easy to view.

Moreover, referring to FIG. 7, the display form changing unit 16 may cause the display unit 18 to display the frequency of the signal to be measured the signal level of which is outside the predetermined range (refer to the sections, "WITHOUT SIGNAL" and "WITH STRONG SIGNAL (ON)" in FIG. 7). In this case, the display form changing unit 16 causes the display unit 18 not to display the frequency of the signal to be measured the signal level of which is inside the predetermined range (refer to the section, "WITH WEAK SIGNAL (ON)" in FIG. 7).

Compared with FIG. 9, there is not a display for the section, "WITH WEAK SIGNAL (ON)" in FIG. 7, and the displays of the frequency in the sections, "WITHOUT SIGNAL" (namely noise) and "WITH STRONG SIGNAL (ON)" can be made easy to view. The display form shown in FIG. 7 is effective for observing the frequency of the noise and the frequency in the section, "WITH STRONG SIGNAL (ON)".

Further, referring to FIG. 8, the display form changing unit 16 may change the display color of the characteristic value (frequency) of the signal to be measured on the display unit 18 according to whether the signal level is inside the predetermined range or not. For example, the sections, "WITHOUT SIGNAL" and "WITH STRONG SIGNAL (ON)" may be displayed in yellow in FIG. 8, and the section, "WITH WEAK SIGNAL (ON)" may be displayed in red in FIG. 8.

Compared with FIG. 9, the display color in the section, "WITH WEAK SIGNAL (ON)" and the display color in the sections, "WITHOUT SIGNAL" (namely the noise) and "WITH STRONG SIGNAL (ON)" are different from each other in FIG. 8, which is effective both for the case of observing the frequency of the signal to be measured and for the case of observing the frequency of the noise.

According to the second embodiment, the change in the display form by the display form changing unit 16 (referring to FIGS. 6-8) can make the display of the characteristic value (such as the frequency) of a signal subject to measure (signal to be measured or the noise) easy to view.

Moreover, the above-described embodiments may be realized in the following manner. A computer is provided with a CPU, a hard disk, and a media (such as a floppy disk (registered trade mark) and a CD-ROM) reader, and the media reader is caused to read a medium recording a program realizing the above-described respective components such as the first characteristic value measurement unit 12, the second characteristic value measurement unit 14, the display form changing unit 16, and the display unit 18 of the signal display device 1, thereby installing the program on the hard disk. This method may also realize the above-described functions.

The invention claimed is:

1. A signal display device comprising:
a first characteristic value measurer that measures a first characteristic value of characteristic values of a signal to be measured;
a display that displays the first characteristic value measured by the first characteristic value measurer, the first characteristic value associated with time;
a second characteristic value measurer that measures a second characteristic value of the characteristic values of the signal to be measured; and
a display form changer that changes a display form on the display according to the second characteristic value measured by the second characteristic value measurer,
wherein the first characteristic value measurer measures at least one of a frequency, a phase and a level of the signal to be measured,
wherein the second characteristic value measurer measures at least one of the frequency, the phase and the level of the signal to be measured,
wherein the display form changer causes the display to display the signal to be measured, the second characteristic value of which is more than a predetermined value, and causes the display not to display the signal to be measured, the second characteristic value of which is less than the predetermined value, and
wherein the signal to be measured is received from outside of the signal display device.

2. The signal display device according to claim 1, wherein the display form changer causes the display to display the signal to be measured, the second characteristic value of which is less than a predetermined value, and causes the display not to display the signal to be measured, the second characteristic value of which is more than the predetermined value.

3. The signal display device according to claim 1, wherein the display form changer causes the display to display the signal to be measured, the second characteristic value of which is inside a predetermined range, and causes the display not to display the signal to be measured, the second characteristic value of which is outside the predetermined range.

4. The signal display device according to claim 1, wherein the display form changer causes the display to display the signal to be measured, the second characteristic value of which is outside a predetermined range, and causes the display not to display the signal to be measured, the second characteristic value of which is inside the predetermined range.

5. The signal display device according to claim 1, wherein the display form changer changes a display color of the signal to be measured on the display according to whether or not the second characteristic value is more than a predetermined value.

6. The signal display device according to claim 1, wherein the display form changer changes a display color of the signal to be measured on the display according to whether or not the second characteristic value is inside a predetermined range.

7. A non-transitory computer-readable medium having a program of instructions for execution by a computer to perform a signal display process, the signal display process comprising:

measuring any one of characteristic values of a signal to be measured, as a first characteristic value, the first characteristic value including at least one of a frequency, a phase and a level of the signal to be measured;

displaying the measured first characteristic value, the measured first characteristic value associated with time;

measuring any one of the characteristic values of the signal to be measured, as a second characteristic value, the second characteristic value including at least one of the frequency, the phase and the level of the signal to be measured; and changing a display form in the displaying, according to the measured second characteristic value, wherein the changing causes a display to display the signal to be measured, the second characteristic value of which is more than a predetermined value, and causes the display not to display the signal to be measured, the second characteristic value of which is less than the predetermined value, and wherein the signal to be measured is received from outside of a signal display device.

\* \* \* \* \*